(12) United States Patent
Koey (10) Patent No.: US 8,765,527 B1
(45) Date of Patent: Jul. 1, 2014

(54) SEMICONDUCTOR DEVICE WITH REDISTRIBUTED CONTACTS

(71) Applicant: Dominic Koey, Kuala Lumpur (MY)

(72) Inventor: Dominic Koey, Kuala Lumpur (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/917,639

(22) Filed: Jun. 13, 2013

(51) Int. Cl.
*H01L 21/44* (2006.01)
*H01L 21/82* (2006.01)

(52) U.S. Cl.
CPC ..................................... *H01L 21/82* (2013.01)
USPC ........... 438/113; 438/109; 438/110; 438/122; 438/126

(58) Field of Classification Search
None
See application file for complete search history.

(56) References Cited

U.S. PATENT DOCUMENTS

| | | | |
|---|---|---|---|
| 6,025,250 A | 2/2000 | Ha et al. | |
| 6,339,251 B2 | 1/2002 | Ha et al. | |
| 7,129,174 B2 | 10/2006 | Kim | |
| 2003/0160303 A1 | 8/2003 | Hirokawa et al. | |
| 2004/0241946 A1 | 12/2004 | Kim et al. | |
| 2006/0027171 A1 | 2/2006 | Hsu | |
| 2009/0140442 A1* | 6/2009 | Lin | 257/778 |
| 2009/0271980 A1 | 11/2009 | Ramanathan | |
| 2010/0167471 A1 | 7/2010 | Jin | |
| 2011/0221053 A1 | 9/2011 | Chandrasekaran | |
| 2011/0260336 A1 | 10/2011 | Kang | |
| 2012/0025362 A1 | 2/2012 | Chandrasekaran | |
| 2012/0119390 A1 | 5/2012 | Oratti Kalandar | |

* cited by examiner

*Primary Examiner* — Kyoung Lee
(74) *Attorney, Agent, or Firm* — Charles Bergere

(57) ABSTRACT

A method of assembling Redistributed Chip Package (RCP) semiconductor devices. An active die structure is encapsulated in a molding compound with internal electrical contacts of the active die structure positioned at an active face of an encapsulation layer. A dummy die structure is positioned at a back face of the encapsulation layer. A redistribution layer is formed at an active face of the encapsulation layer. The redistribution layer includes a layer of insulating material and redistribution electrical interconnections. The insulating material is built up with grooves along saw streets. External electrical contacts exposed at a surface of the redistribution layer are connected with the redistribution electrical interconnections. The dummy die structure is removed and then the semiconductor devices are singulated.

19 Claims, 6 Drawing Sheets

SEMICONDUCTOR DEVICE WITH REDISTRIBUTED CONTACTS

BACKGROUND OF THE INVENTION

The present invention is directed to a method of assembling semiconductor device, and, more particularly, to semiconductor devices that have redistribution interconnections between internal contacts on one or more semiconductor dies and external contacts exposed on an active face of the device package.

Semiconductor device packaging fulfils basic functions such as providing electric connections and protecting the die against mechanical and environmental stresses. Continued progress in reduction of the size of the semiconductor dies and increased functionality and complexity of the electronic circuits integrated in the dies requires size reduction of the packaging with the same or greater complexity of the electrical connections with external circuits.

Semiconductor devices are commonly encapsulated for surface mounting by embedding one or more semiconductor dies in a mold compound. The external electrical contacts for connection with external circuits are exposed at the active face of the package and connected internally with electrical contact pads on the semiconductor die of smaller size and spacing. The exposed external contacts may be a ball grid array (BGA) or a land grid array (LGA), for example. Various techniques are available for connecting the exposed external electrical contacts of the package with the internal contacts of the embedded semiconductor die.

Minimum values are specified for the size of the individual exposed external electrical contact surfaces at the active face of the device and for the spacing between adjacent external electrical contact surfaces. Such specifications necessitate a compromise between the overall size of the active face of the device and the number of individual external electrical contact surfaces.

In wafer level packaging (WLP), the redistribution layer is built up on the wafer before the devices are separated by singulation and then the devices are encapsulated. The exposed external contacts are limited to the area of the active face of the die, the redistribution layer serving to 'fan in' the contacts so as to make greater use of the available die face area, than if the exposed external contacts of the device were aligned with the positions of the internal contacts on the semiconductor die dictated by the topography of the underlying circuits in the body of the semiconductor material.

In a technique known as redistributed chip packaging (RCP), after singulation of the semiconductor die a redistribution layer provides electrical interconnections between the internal set of contacts on the semiconductor die and the exposed external contacts at the active face of the device, to route out signal connections and power and ground connections. The redistribution layer fans out the exposed external contacts, offering a larger area than the active face of the die for the exposed external contacts and enabling larger exposed contacts to be used, with greater spacing between them.

In one convenient technique of production of embedded RCP devices, an array of singulated dies is placed with their active faces on a temporary support. The dies are encapsulated by embedding the array with a molding compound and then releasing the encapsulated array from the support, forming an encapsulation layer of a panel. The encapsulation layer can then be processed by techniques somewhat similar to wafer processing to build up the redistribution layer on the active face of the panel. The redistribution layer may be built up from the active face of the panel by successive operations of depositing insulating material and depositing sets of electrical interconnections, which may have horizontal traces and vias providing vertical connections between the levels of horizontal traces, and which are separated by the insulating material from each other and from unintended connection with conductive surfaces of the die. The interconnections may be deposited by vapor deposition and/or electroplating techniques, and patterned using photo mask and batch process lithography, among other techniques. Connection with signal input/output and power and ground pads on the active faces of the dies may be made during deposition of the interconnections. The packaged devices are singulated after completion of the redistribution layer.

Unless precautions are taken, the encapsulation layer is subject to degrees of warping which interfere with holding it in a tool to perform subsequent processing operations. It is possible to reduce deformation of the encapsulation layer by securing the encapsulation layer to a stiffening plate using an adhesive but suitable stiffening plates, of ceramic for example, are expensive and detaching the panel from the plate by dissolving the adhesive can lengthen processing times unacceptably and deteriorate other components of the finished package.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. In particular, for the sake of clear visualization, certain vertical dimensions have been exaggerated relative to certain horizontal dimensions.

DETAILED DESCRIPTION OF THE INVENTION

Figure 1:
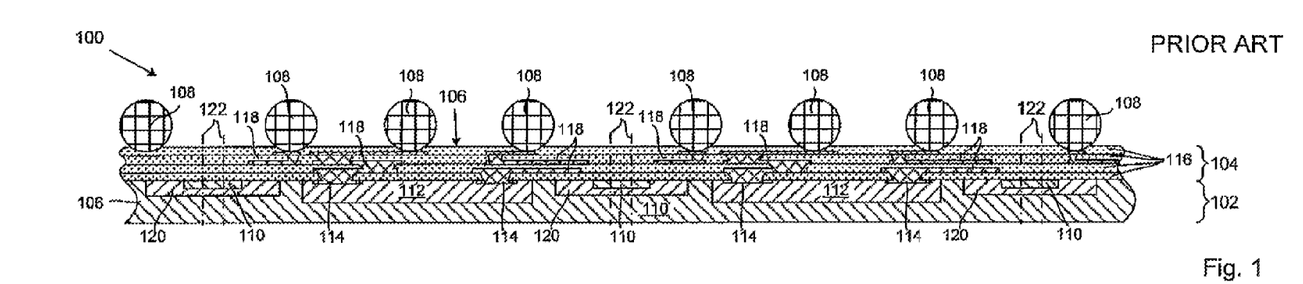
FIG. 1 is a schematic sectional view of a panel with an encapsulation layer and a built up redistributed chip package layer for use in making redistributed chip package semiconductor devices.
Figure 2:
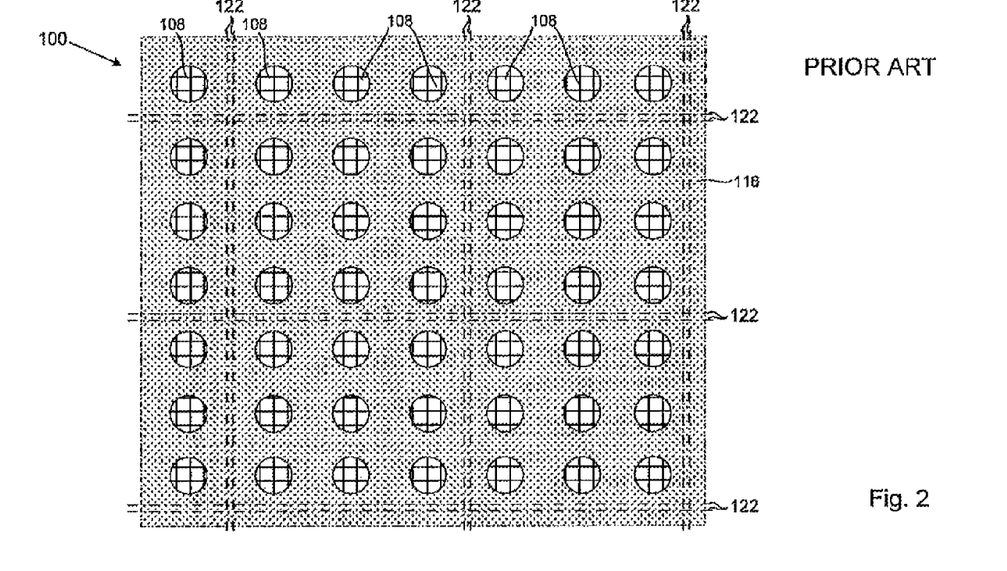
FIG. 2 is a schematic top view of the panel of FIG. 1 (to a smaller scale than FIG. 1)
Figure 3:
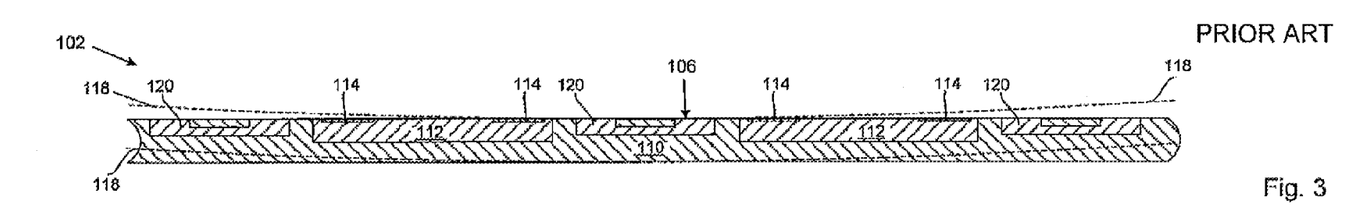
FIG. 3 is a schematic sectional view of an encapsulation layer during one conventional method of making the panel of FIGS. 1 and 2.
Figure 4:
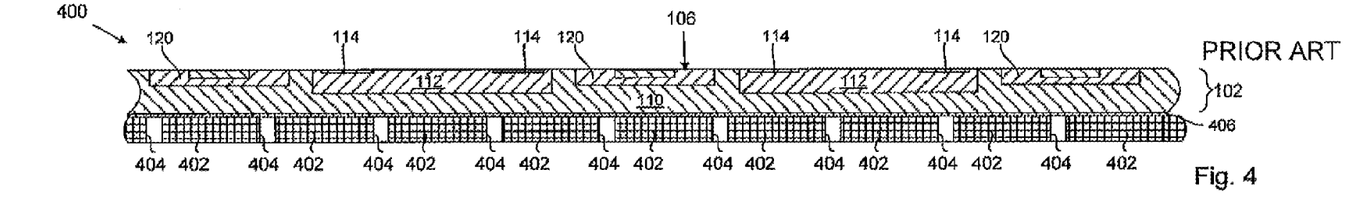
FIG. 4 is a schematic sectional view of an encapsulation layer mounted on a stiffening plate during another conventional method of making the panel assembly of FIGS. 1 and 2.

FIGS. 1 and 2 illustrate a panel 100 with an encapsulation layer 102 and a built up redistributed chip package (RCP) layer 104 for use in making RCP semiconductor devices, and FIGS. 3 and 4 illustrate conventional methods of making the panel 100 of FIGS. 1 and 2. For simplicity, the panel 100 is shown with few semiconductor devices and few electrical contacts for each semiconductor device. It will be appreciated that typically such a panel has many more semiconductor devices and a much greater complexity of electrical contacts for each semiconductor device.

The panel 100 has an active device face 106 on the RCP layer 104 and sets of external electrical contacts 108 exposed at the active device face 106. The encapsulation layer 102 includes a layer of molding compound 110 encapsulating a die structure including an array of semiconductor dies 112, each of which has a set of internal electrical contacts 114 at an active die face. The external electrical contacts 108 are offset from the internal electrical contacts 114 laterally of the active device face 106 and protrude from the active device face 106. The RCP layer 104 is built up on the active face of the encapsulation layer 102 with strata of insulating material 116 and redistribution interconnections 118 embedded within the insulating material 116. The interconnections 118 have horizontally extending traces, and vertically extending vias linking different levels of the horizontal traces, and connect the internal electrical contacts 114 with the exposed electrical contacts 108.

The encapsulated die structure also includes a lead frame which has an array of electrically conductive elements 120 interposed between the semiconductor dies 112 and which form embedded ground planes for the finished semiconductor devices after singulation. The panel 100 may be singulated, by sawing or scribing for example, along singulation streets shown by chain dotted lines 122. The thickness of the lead frame may be reduced by etching in areas between the elements 120 adjacent the singulation streets 122 and etched right through in other areas between the elements 120 in the singulation streets 122 to facilitate singulation, the etched areas being filled by the molding compound 110 after encapsulation.

The die structure is encapsulated by applying the molding compound 110 in a liquid or semi-liquid state and curing it by heating. As illustrated in dashed lines in FIG. 3, it has been found that the encapsulation layer 102 deforms under heating to degrees which interfere with fastening it on a tool to perform subsequent processing operations. In one specific example of a panel of 300 mm diameter, the deformation represented a warping of 2 mm at the periphery. Such a deformation interferes with holding the back face of the encapsulation layer 102 by suction in a vacuum chuck or table and on a heater block for subsequent processing, such as building up the RCP layer 104, solder paste printing, and uniform heating operations, for example. Even when it is possible to hold the panel in place, uniformity of dielectric thickness, via size and depth, interconnection trace width and thickness, and solder paste thickness and solder ball position across the RCP layer 104 may be adversely affected.

FIG. 4 illustrates a sub-assembly 400 that makes it possible to reduce the deformation of the encapsulation layer 102. In the sub-assembly 400, the encapsulation layer 102 is secured to a ceramic plate 402 having perforations 404, using a silicone adhesive tape 406 with a polyester release liner, for example. However, the ceramic plate 402 is costly. In addition, dissolving the silicone adhesive 406 (through the perforations 404) is undesirably slow (taking 5 to 10 hours in practical examples), and the solvent used, such as sulphonic acid may attack other elements of the panel such as the external contact BGA.

FIGS. 5 to 17 illustrate methods in accordance with embodiments of the invention, given by way of example, of making encapsulated, redistributed chip package semiconductor devices 1500 (FIG. 15) each having at least one active semiconductor die 112, internal electrical contacts 114 on the active semiconductor die 112, exposed external electrical contacts 108 and redistribution electrical interconnections 118 between the internal electrical contacts 114 and the external electrical contacts 108. The methods illustrated in FIGS. 5 to 17 comprise providing an active die structure including an array of the active semiconductor dies 112 and providing a dummy die structure including an array of dummy semiconductor dies 500. The active die structure and the dummy die structure are encapsulated to form an encapsulation layer 502 in molding compound 110, with the internal electrical contacts 114 of the active die structure positioned at an active face 504 of the layer 502, and with the dummy die structure positioned at a back face 506 of the layer 502 and aligned with the active die structure. A redistribution layer 600 is provided at the active face 504 of the layer 502 of molding compound, the redistribution layer 600 including a layer of insulating material 602, and an array of sets of the redistribution electrical interconnections 118 embedded within the insulating material 602. External electrical contacts 108 are provided connected with the redistribution electrical interconnections 118 and exposed at a surface of the redistribution layer 600. The dummy die structure (including the array of dummy semiconductor dies 500) is removed and the semiconductor devices 1500 are singulated. The active die structure (including the array of the active semiconductor dies 112) and the dummy die structure (including the array of dummy semiconductor dies 500) may have the same topography.

The active die structure (including the array of the active semiconductor dies 112) may include an array of electrically conductive elements 120 interposed between the active semiconductor dies 112, and the dummy die structure (including the array of dummy semiconductor dies 500) may include a further array of electrically conductive elements 508 interposed between the dummy semiconductor dies 500, the electrically conductive elements 508 of the dummy die structure being aligned with the electrically conductive elements 120 of the active die structure.

Encapsulating the die structures may comprise providing first and second temporary support members 900 and 1100. The active die structure (including the array of the active semiconductor dies 112) is mounted on a face of the first temporary support member 900 with the internal electrical contacts 114 contacting the face of the first temporary support member 900. The layer 502 of molding compound 110 is applied to encapsulate the active die structure. The dummy die structure (including the array of dummy semiconductor dies 500) is mounted on a face of the second temporary support member 1100, and the dummy die structure is embedded in the back face of the layer of molding compound. Encapsulating the die structures may include removing the first and second temporary support members 900 and 1100, and curing the molding compound 110.

Providing the redistribution layer 600 may include successive build-up operations of the insulating material 602 and of the sets of redistribution electrical interconnections 118 from the active face 504 of the layer 502 of molding compound. Successive build-up operations of the insulating material 602 may be performed with grooves 606 therein along singulation streets 122 for singulating the semiconductor devices 1500, the grooves 606 relieving lateral stresses in the redistribution layer. The successive build-up operations of the insulating material 602 may each include applying the insulating material 602, and removing the insulating material 602 from selected areas to form the grooves 606 and to form via apertures for the redistribution electrical interconnections 118. The grooves 606 may expose the active face 504 of the layer 502 of molding compound along singulation streets 122 for singulating the semiconductor devices.

Removing the dummy die structure (including the array of dummy semiconductor dies 500) may include protecting the external electrical contacts 108 connected with the redistribution electrical interconnections 118 with a temporary protective layer, removing material from the back face 506 of the layer 502 of molding compound, and removing the temporary protective layer.

FIGS. 5 to 17 also illustrate methods in accordance with embodiments of the invention, given by way of example, of making such RCP semiconductor devices, and which comprise providing an active die structure including an array of the active semiconductor dies 112 and providing a dummy die structure including an array of dummy semiconductor dies 500. The active die structure and the dummy die structure are encapsulated to form an encapsulation layer 502 in molding compound 110, with the internal electrical contacts 114 of the active die structure positioned at an active face 504 of the layer 502, and with the dummy die structure embedded in a back face 506 of the layer 502. A redistribution layer 600 is provided at the active face 504 of the layer 502 of molding compound, the redistribution layer 600 including a layer of insulating material 602, and an array of sets of the redistribution electrical interconnections 118 embedded within the insulating material 602. The redistribution layer has grooves 606 therein, the grooves 606 relieving lateral stresses in the redistribution layer. External electrical contacts 108 are provided connected with the redistribution electrical interconnections and exposed at a surface of the redistribution layer 600. The dummy die structure (including the array of dummy semiconductor dies 500) is removed and the semiconductor devices 1500 are singulated along the grooves and in singulation streets.

Figure 7:
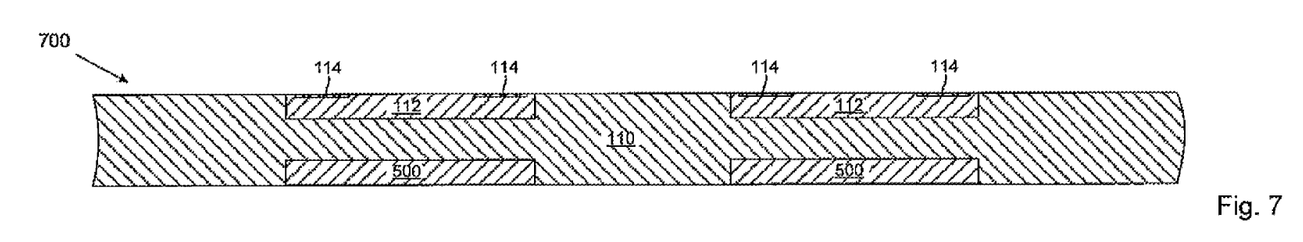
FIG. 7 is a schematic sectional view of an encapsulation layer at a stage of a method of making redistributed chip package semiconductor devices in accordance with another embodiment of the invention, given by way of example.
Figure 8:
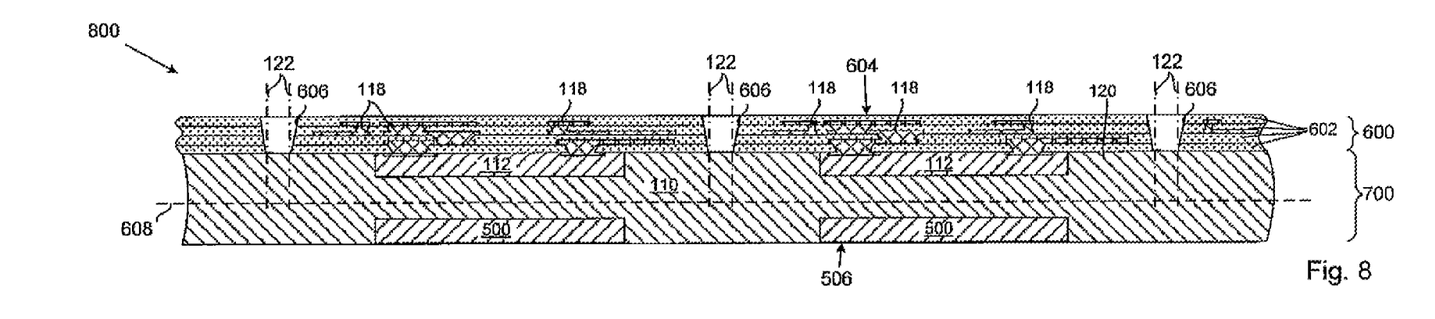
FIG. 8 is a schematic sectional view of a panel including the encapsulation layer of FIG. 7 during a subsequent stage of the method of making redistributed chip package semiconductor devices in accordance with this other embodiment of the invention, given by way of example.

In more detail, in the methods illustrated in FIGS. 5 to 17, the dummy die structure including the array of dummy semiconductor dies 500 is of substantially identical dimensions and materials as the active die structure including the array of the active semiconductor dies 112, so that the two structures have identical expansion and contraction characteristics. However it is unnecessary for the dummy semiconductor dies 500 to contain the electronic circuits and contact pads that are features of the active semiconductor dies 112, produced by wafer processing, and the dummy dies 500 may be blank, unprocessed dies, saving cost, or even rejected processed dies. As illustrated in FIGS. 5, 6 and 9 to 15, when the active die structure includes an array of electrically conductive elements 120 interposed between the active semiconductor dies 112, forming an embedded ground plane (EGP) in the finished devices 1500, the dummy die structure includes a further array of electrically conductive elements 508 interposed between the dummy semiconductor dies 500. In this example, the further array of electrically conductive elements 508 is of the same material, topography (including any half-etched or fully-etched areas), thickness and lateral dimensions as the active array of electrically conductive elements 120. The further array of electrically conductive elements 508 may in this example be identical to the active array of electrically conductive elements 120. As illustrated in FIGS. 7 and 8, in another embodiment of the invention, the active die structure does not include any array of EGP electrically conductive elements 120, and in this example, nor does the dummy die structure include any further array of electrically conductive elements 508.

Figure 16:
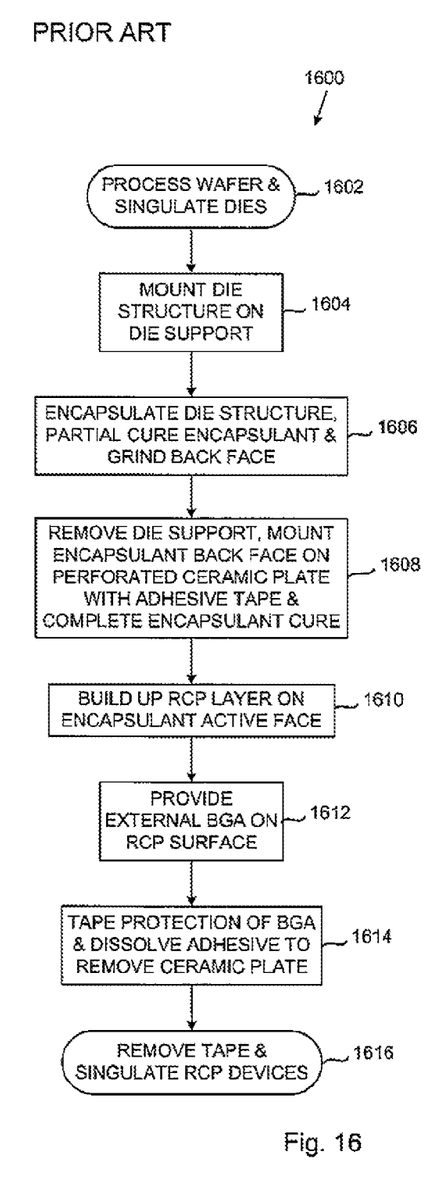
FIG. 16 is a flow chart of a conventional method of making redistributed chip package semiconductor devices using the encapsulation layer of FIG. 4.

FIG. 16 illustrates a conventional method 1600 of making RCP semiconductor devices using a sub-assembly 400 of an encapsulation layer 102 mounted on a stiffening plate 402.

Figure 17:
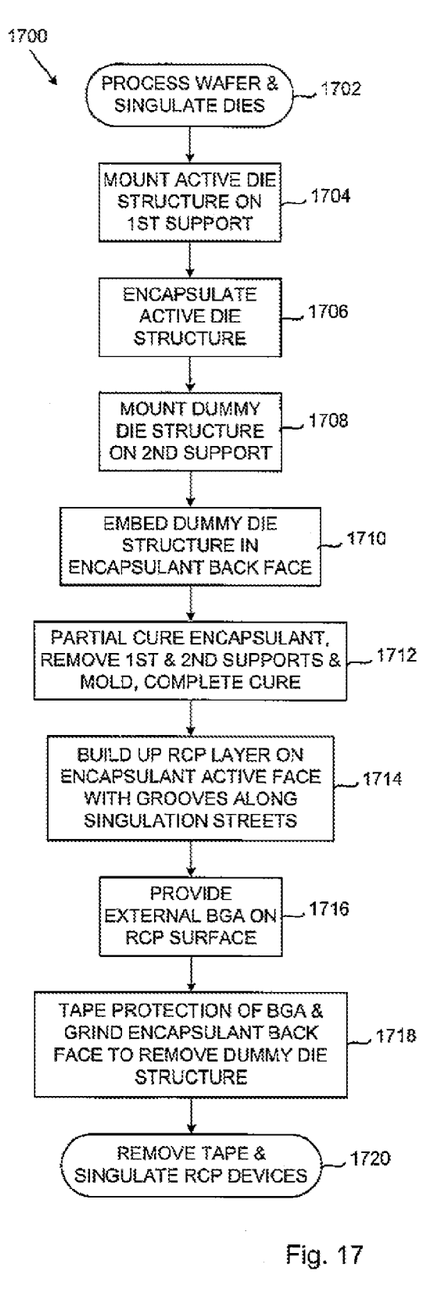
FIG. 17 is a flow chart of a method of making redistributed chip package semiconductor devices using the encapsulation layer and panel of FIGS. 5 and 6 in accordance with an embodiment of the invention, given by way of example.

FIG. 17 illustrates a method 1700 of making RCP semiconductor devices 1500 in accordance with examples of embodiments of the invention, and using examples of sub-assemblies illustrated in FIGS. 5, 6 and 9 to 14.

The method 1600 starts at 1602 by processing a wafer (not shown) and singulating dies 112 with electronic circuits and contact pads forming internal electrical contacts 114. At 1604, a die structure including the EGP electrically conductive elements 120 and the semiconductor dies 112 is mounted on a temporary support member (not shown) with a mold (not shown). At 1606, the die structure is encapsulated by applying molding compound 110, the molding compound is subjected to vacuum to remove air bubbles and partially cured, the mold removed, and the back face of the layer 102 is ground flat. At 1608, the perforated ceramic stiffener plate 402 is attached to the back face of the encapsulation layer 102 using silicone adhesive tape 406 with a polyester release liner, the temporary support member is removed, and the curing of the molding compound 110 is completed. The RCP layer 104 is built up on the active face of the encapsulation layer 102 at 1610 and at 1612 BGAs forming the external electrical contacts 108 are added at the active face of the RCP layer 104. At 1614, tape (not shown) is applied to protect the external electrical contacts 108 and the panel soaked in sulphonic acid for 5 to 10 hours to dissolve the silicone adhesive 406 so as to enable the perforated ceramic stiffener plate 402 to be removed. At 1616, the tape protection is removed and the packaged devices singulated.

Figure 9:
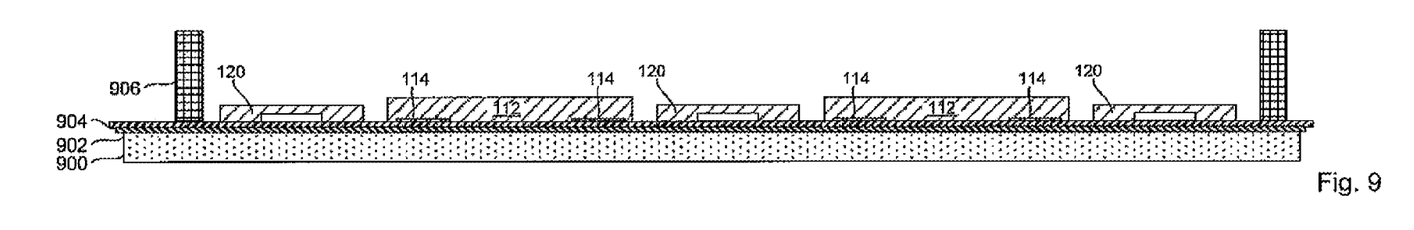
FIGS. 9 to 12 are schematic sectional views at successive stages of a method of producing the encapsulation layer of FIG. 5.

The method 1700 starts at 1702 by processing an active wafer (not shown) and singulating active dies 112 with electronic circuits and contact pads forming internal electrical contacts 114, and also singulating a wafer with dummy or blank dies 500. Alternatively, reject dies could be used as the dummy dies. At 1704, an active die structure is mounted on a temporary glass support member 900 using thermal release tape 902 and double-sided silicone/polyimide tape 904 with a mold 906 (FIG. 9). In this example, the thermal release tape 902 used has a bottom side adhesive that is sensitive to thermal heat at 150° C. and will detach from the glass support 900 at that temperature. However the double sided silicon polyimide tape 904 used is not sensitive to thermal heat until more than 150° C. The active die structure has a lead frame including the EGP electrically conductive elements 120 that is placed on the tape 904, and the active semiconductor dies 112 that are then picked and placed on the tape 904 between the EGP electrically conductive elements 120.

Figure 10:
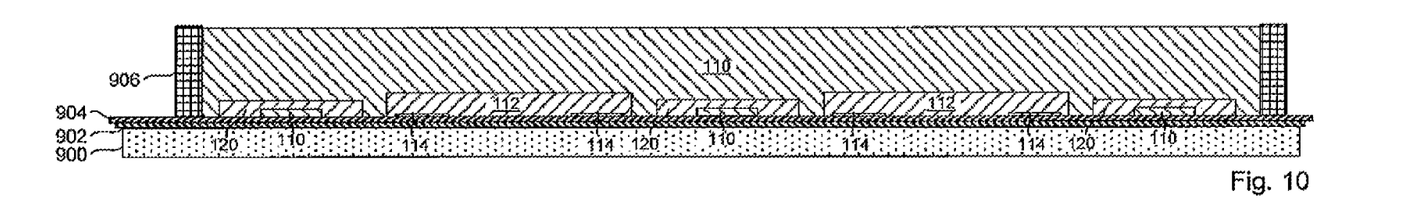
Figure 11:
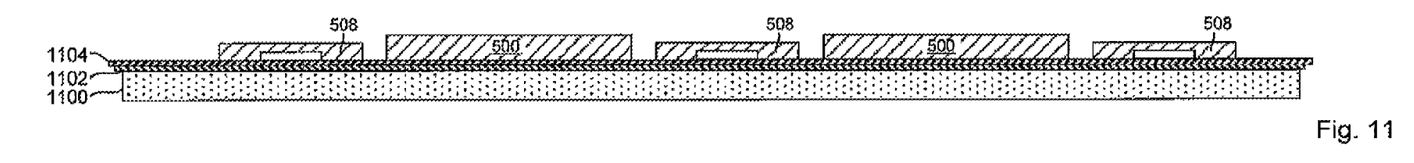

At 1706, the active die structure is encapsulated by applying liquid or semi-liquid molding compound 110, as shown in FIG. 10 and the molding compound 110 is subjected to vacuum to extract air bubbles that could cause voids in the molding compound. At 1708, the dummy die structure is mounted on a temporary glass support member 1100 (FIG. 11) using thermal release tape 1102 and double-sided silicone/polyimide tape 1104. The dummy die structure has a further lead frame including the electrically conductive elements 508 which is placed on the tape 1104, and the dummy semiconductor dies 500, which are then picked and placed on the tape 1104 between the further electrically conductive elements 508. In this example, the lead frame including the further electrically conductive elements 500 is identical to the lead frame including the EGP electrically conductive elements 120. In a variant of this example, the dummy die structure is mounted on the temporary glass support member 1100 at 1708 before the active die structure is encapsulated at 1706.

Figure 5:
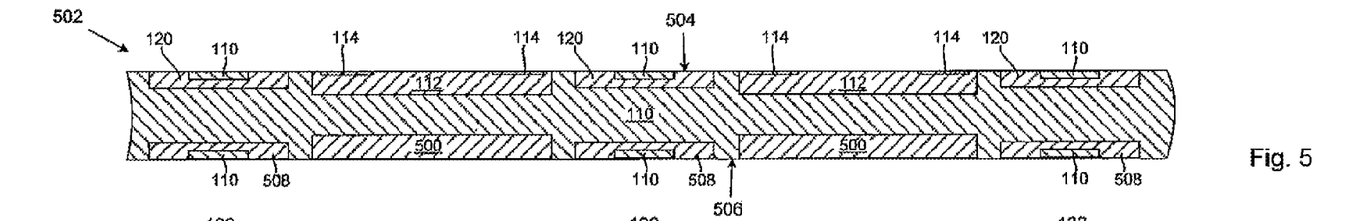
FIG. 5 is a schematic sectional view of an encapsulation layer at a stage of a method of making redistributed chip package semiconductor devices in accordance with an embodiment of the invention, given by way of example.
Figure 6:
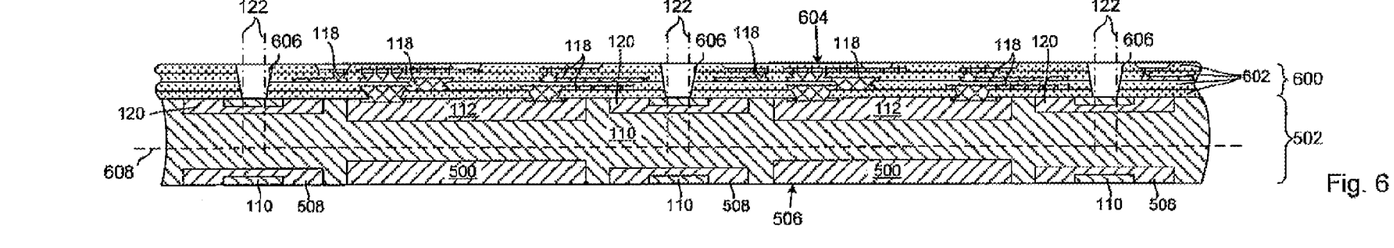
FIG. 6 is a schematic sectional view of a panel including the encapsulation layer of FIG. 5 during a subsequent stage of the method of making redistributed chip package semiconductor devices in accordance with an embodiment of the invention, given by way of example.
Figure 12:
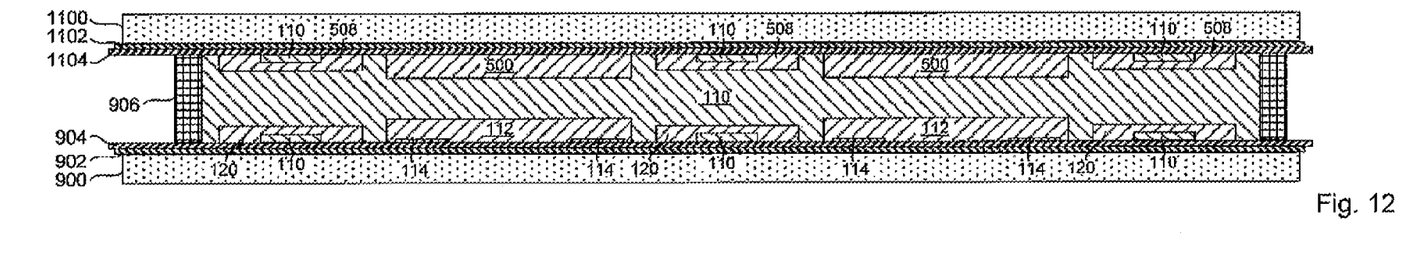

At 1710, the dummy die structure on the temporary glass support member 1100 is applied to the back face of the molding compound 110, as shown in FIG. 12, with the dummy die structure including the dummy semiconductor dies 500 and the electrically conductive elements 508 embedded in the back face of the molding compound 110. The molding compound is cured only partially at this stage, for example at 100° C. for 1 hour. At 1712, the glass support 900, and the tape 902, 904 are heated, for example to 150° C. during 2.5 minutes, so that thermal release tape 902 releases the temporary glass support member 900. The mold 906 is then removed, and the glass support 1100, and the tape 1102, 1104 are heated, for example to 150° C. during 2.5 minutes, so that the thermal release tape 1102 releases the temporary glass support member 1100. The assembly is then heated to a temperature, such as 180° C., sufficient for the pairs of tapes 902 and 904 and of tapes 1102 and 1104 to be peeled off, producing the panel 502 (FIG. 5). The front face of the panel 502 is exposed to sulphonic acid to dissolve residues of the silicone/polyimide tape 1104, and then to isopropyl alcohol (IPA), to wash away the sulphonic acid in order to clean the surfaces of the active dies 112 and the contact pads 114. Curing of the molding compound 110 is then completed by heating the panel to 150° C. during 1 hour, for example.

Figure 13:
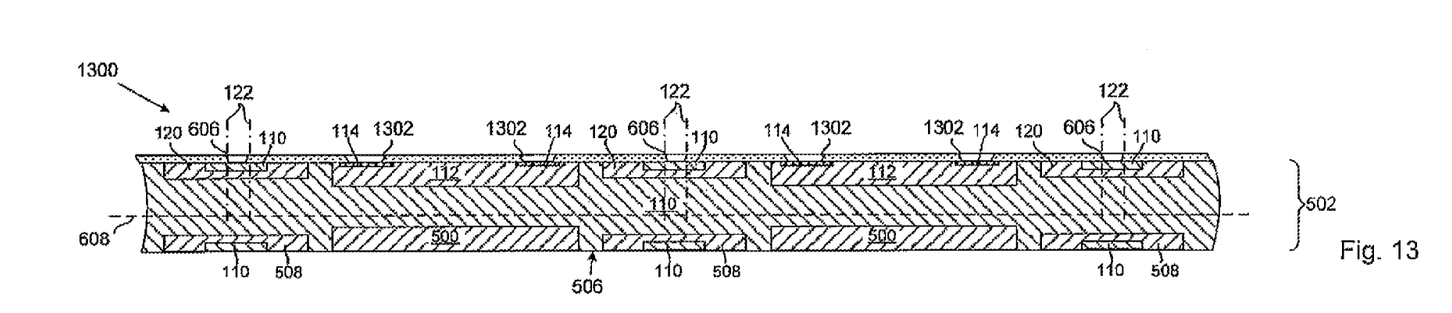
FIGS. 13 and 14 are schematic sectional views at successive stages of a method of producing the panel of FIG. 6.
Figure 14:
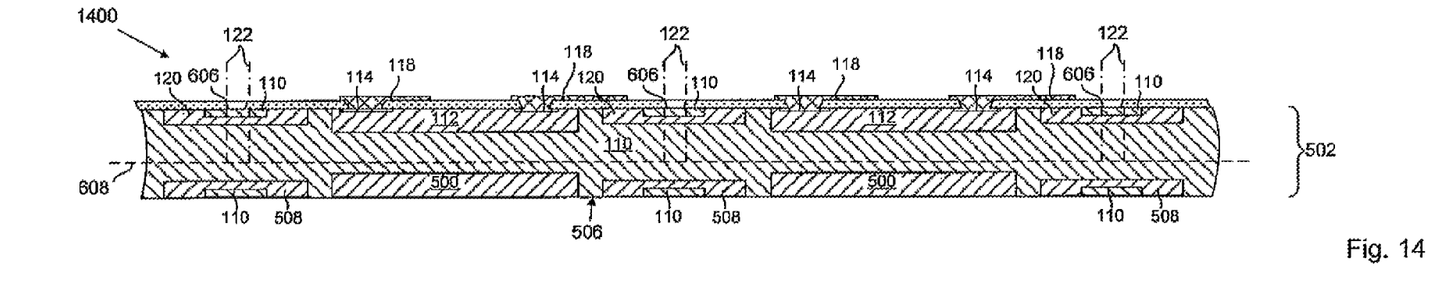
Figure 15:
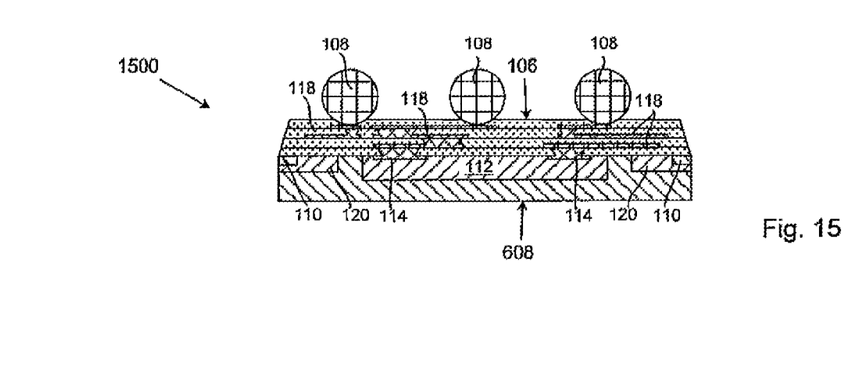
FIG. 15 is a schematic sectional view of a semiconductor device made in accordance with the method illustrated in FIGS. 5, 6 and 9 to 14.

Since the active die structure and the dummy die structure have identical expansion and contraction characteristics, the back face 506 of the panel 502 remains sufficiently planar to be held in tools for subsequent processing operations without the back face of the layer 102 being ground at this stage. The RCP layer 104 is built up on the active face of the encapsulation layer 502 at 1714 by successive operations illustrated in FIGS. 13 and 14. As shown in FIG. 13 at 1300, insulating material 602 is applied across the front face of the panel 502, and insulating material 602 is removed from selected areas to form the grooves 606 and to form via apertures 1302 for the redistribution electrical interconnections 118. The selective build-up of the dielectric material may be performed by polymerizing the dielectric material 602 except in the unwanted areas which are masked and dissolving the non-polymerized material, or by attacking the dielectric material 602 in the unwanted areas while shielding the wanted areas from attack, for example. As shown in FIG. 14 at 1400, the redistribution electrical interconnections 118 for embedding within the insulating material 602 are then applied, for example by sputtering or physical vapor deposition (PVD) of metal on the surface of the insulating material 602, selectively masking unwanted areas of the deposited metal by photo-resist material, and electroplating metal on the wanted areas in the via apertures 1302 and along the redistribution interconnection traces. The build-up operations 1714 are repeated until the RCP layer 602 is completed. In this example, the grooves 606 in the selected areas of the insulating material 602 expose the active face 504 of the layer 502 of molding compound along the singulation streets 122.

At 1715, BGAs or other external electrical contacts 108 are added at the active face 604 of the RCP layer 602. At 1716, tape (not shown) is applied to protect the external electrical contacts 108 and the back face 506 of the panel is machined down, for example by grinding, to the level indicated by the dashed line 608 to remove the dummy die structure including the array of dummy semiconductor dies 500. At 1717, the tape protection is removed and the packaged devices are singulated along the singulation streets 122, by sawing or scribing for example, producing the packaged semiconductor device 1500 illustrated in FIG. 15.

In the foregoing specification, the invention has been described with reference to specific examples of embodiments of the invention. It will, however, be evident that various modifications and changes may be made therein without departing from the broader spirit and scope of the invention as set forth in the appended claims. For example, the semiconductor material of the dies described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of assembling semiconductor devices each having at least one semiconductor die, internal electrical contacts on an active surface of the semiconductor die, exposed external electrical contacts, and redistribution electrical interconnections between the internal electrical contacts and the external electrical contacts, the method comprising:
   providing an active die structure including an array of the semiconductor dies;
   providing a dummy die structure including an array of dummy semiconductor dies;
   encapsulating the active die structure and the dummy die structure in a layer of molding compound, wherein the internal electrical contacts of the semiconductor dies of the active die structure are positioned at an active face of the layer of molding compound, and the dummy die structure is positioned at a back face of the layer of molding compound and aligned with the active die structure;
   providing a redistribution layer at the active face of the layer of molding compound, the redistribution layer including a layer of insulating material, and an array of sets of the redistribution electrical interconnections embedded within the insulating material;
   providing the external electrical contacts connected with the redistribution electrical interconnections and exposed at a surface of the redistribution layer;
   removing the dummy die structure; and
   singulating the semiconductor devices.

2. The method of claim 1, wherein the active die structure includes an array of electrically conductive elements interposed between the semiconductor dies, and the dummy die structure includes a dummy array of electrically conductive elements interposed between the dummy semiconductor dies, wherein the electrically conductive elements of the dummy die structure are aligned with the electrically conductive elements of the active die structure.

3. The method of claim 1, wherein the active die structure and the dummy die structure have the same topography.

4. The method of claim 1, wherein encapsulating the active die structure and the dummy die structures includes:
   providing first and second temporary support members;
   mounting the active die structure on a face of the first temporary support member with the internal electrical contacts contacting a face of the first temporary support member;
   applying the layer of molding compound to encapsulate the active die structure;
   mounting the dummy die structure on a face of the second temporary support member; and
   embedding the dummy die structure in the back face of the layer of molding compound.

5. The method of claim 4, wherein encapsulating the active and dummy die structures includes removing the first and second temporary support members, and curing the molding compound.

6. The method of claim 1, wherein providing the redistribution layer includes successive build-up operations of the insulating material and of the sets of redistribution electrical interconnections from the active face of the layer of molding compound.

7. The method of claim 1, wherein providing the redistribution layer includes successive build-up operations of the insulating material with grooves therein along singulation streets for singulating the semiconductor devices, wherein the grooves relieve lateral stresses in the redistribution layer.

8. The method of claim 7, wherein the successive build-up operations of the insulating material each include applying the insulating material, and removing the insulating material from selected areas to form the grooves and to form via apertures for the redistribution electrical interconnections.

9. The method of claim 7, wherein the grooves expose the active face of the layer of molding compound along singulation streets for singulating the semiconductor devices.

10. The method of claim 1, wherein removing the dummy die structure includes:
    protecting the external electrical contacts connected with the redistribution electrical interconnections with a temporary protective layer;
    removing material from said back face of said layer of molding compound; and
    removing the temporary protective layer.

11. A method of assembling semiconductor devices each having at least one active semiconductor die, internal electrical contacts on an active surface of the active semiconductor die, exposed external electrical contacts and redistribution electrical interconnections between the internal electrical contacts and the external electrical contacts, the method comprising:
    providing an active die structure including an array of the active semiconductor dies;
    providing a dummy die structure including an array of dummy semiconductor dies;
    encapsulating the active die structure and the dummy die structure in a layer of molding compound, wherein the internal electrical contacts of the active die structure are positioned at an active face of the layer of molding compound, and the dummy die structure is embedded in a back face of the layer of molding compound;
    providing a redistribution layer at the active face of the layer of molding compound, wherein the redistribution layer includes a layer of insulating material, and an array of sets of the redistribution electrical interconnections embedded within the insulating material, the redistribution layer having grooves therein that relieve lateral stresses in the redistribution layer;
    providing the external electrical contacts connected with the redistribution electrical interconnections and exposed at a surface of the redistribution layer;
    removing the dummy die structure; and
    singulating the semiconductor devices along the grooves and in singulation streets.

12. The method of claim 11, wherein providing the redistribution layer includes successive build-up operations of the insulating material and of the sets of redistribution electrical interconnections from the active face of the layer of molding compound.

13. The method of claim 12, wherein the successive build-up operations of the insulating material each include applying the insulating material, and removing the insulating material from selected areas to form the grooves and to form via apertures for the redistribution electrical interconnections.

14. The method of claim 11, wherein providing the redistribution layer includes successive build-up operations of the insulating material with the grooves therein exposing the active face of the layer of molding compound along the singulation streets.

15. The method of claim 11, wherein the active die structure includes an array of electrically conductive elements interposed between the active semiconductor dies, and the dummy die structure includes a further array of electrically conductive elements interposed between the dummy semiconductor dies, wherein the electrically conductive elements of the dummy die structure are aligned with the electrically conductive elements of the active die structure.

16. The method of claim 11, wherein the active die structure and the dummy die structure have the same topography.

17. The method of claim 11, wherein encapsulating the semiconductor dies comprises:
   providing first and second temporary support members;
   mounting the active die structure on a face of the first temporary support member with the internal electrical contacts contacting the face of the first temporary support member;
   applying the layer of molding compound to encapsulate the active die structure;
   mounting the dummy die structure on a face of the second temporary support member; and
   embedding the dummy die structure in the back face of the layer of molding compound.

18. The method of claim 17, wherein encapsulating the semiconductor dies includes removing the first and second temporary support members, and curing the molding compound.

19. The method of claim 11, wherein removing the dummy die structure includes:
   protecting the external electrical contacts connected with the redistribution electrical interconnections with a temporary protective layer;
   removing material from the back face of the layer of molding compound; and
   removing the temporary protective layer.

* * * * *